(12) United States Patent
Prasher et al.

(10) Patent No.: US 7,212,405 B2
(45) Date of Patent: May 1, 2007

(54) METHOD AND APPARATUS FOR PROVIDING DISTRIBUTED FLUID FLOWS IN A THERMAL MANAGEMENT ARRANGEMENT

(75) Inventors: Ravi S. Prasher, Tempe, AZ (US); Robert Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 320 days.

(21) Appl. No.: 10/856,896

(22) Filed: May 27, 2004

(65) Prior Publication Data
US 2005/0264997 A1 Dec. 1, 2005

(51) Int. Cl.
*H05K 7/20* (2006.01)

(52) U.S. Cl. ............ 361/699; 361/710; 257/714

(58) Field of Classification Search .......... 361/699, 361/709–711, 702; 257/713, 714
See application file for complete search history.

(56) References Cited
U.S. PATENT DOCUMENTS

| 5,388,635 | A * | 2/1995 | Gruber et al. ........... 165/80.4 |
|---|---|---|---|
| 6,679,315 | B2 * | 1/2004 | Cosley et al. ........... 165/80.4 |
| 6,988,534 | B2 * | 1/2006 | Kenny et al. ............ 165/80.4 |
| 7,000,684 | B2 * | 2/2006 | Kenny et al. ............ 165/80.4 |
| 2003/0205054 | A1 * | 11/2003 | Nori et al. ............... 62/259.4 |
| 2004/0250994 | A1 * | 12/2004 | Chordia .................. 165/80.4 |
| 2005/0098299 | A1 * | 5/2005 | Goodson et al. ........ 165/80.3 |
| 2005/0117301 | A1 * | 6/2005 | Prasher et al. ........... 361/699 |
| 2005/0141195 | A1 * | 6/2005 | Pokhama et al. ........ 361/699 |
| 2005/0200001 | A1 * | 9/2005 | Joshi et al. .............. 257/712 |
| 2005/0205241 | A1 * | 9/2005 | Goodson et al. ........ 165/80.4 |

OTHER PUBLICATIONS

Kandlikar, S. G., "A General Correlation for Saturated Two-Phase Flow Boiling Heat Transfer Inside Horizontal and Vertical Tubes," Journal of Heat Transfer, Transactions of the ASME, Feb. 1990, vol. 112, pp. 219-228.

* cited by examiner

*Primary Examiner*—Anatoly Vortman
(74) *Attorney, Agent, or Firm*—Schwabe, Williamson & Wyatt, P.C.

(57) ABSTRACT

Embodiments of the present invention include an apparatus, method, and system for providing a flow distributive interface for a thermal management arrangement.

5 Claims, 4 Drawing Sheets

METHOD AND APPARATUS FOR PROVIDING DISTRIBUTED FLUID FLOWS IN A THERMAL MANAGEMENT ARRANGEMENT

FIELD OF THE INVENTION

Disclosed embodiments of the present invention relate to the field of integrated circuits, and more particularly to providing distributed cooling fluid flows for a thermal management arrangement.

BACKGROUND OF THE INVENTION

Thermal management is of great importance to the operation of semiconductor devices. Thermal management is especially important in the operation of silicon microprocessors as relentlessly increasing frequency targets push power output, and therefore heat generation, to the limits of the cooling capacity of passive air-cooled heatsink technology. Insufficient transfer of heat away from a semiconductor device can result in degradation in performance and reliability of that device or circuit.

Recent focus has turned to thermal management arrangements utilizing fluid flowing through parallel microchannels to dissipate heat. The microchannels each have similar dimensions and each have an input to receive fluid from an inlet coupled to a remote pump, and an output to transmit the fluid through an outlet towards a heat exchanger. This design may result in a large portion of the fluid flowing through the microchannels in line with the inlet and the outlet and a much smaller portion of the fluid flowing through the microchannels at the periphery, which require the flow lines to bend significantly.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION OF EMBODIMENTS OF THE INVENTION

A method, apparatus, and system for providing a flow distributive interface in a thermal management arrangement is disclosed herein. In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions and references (e.g., up, down, top, bottom, etc.) may be used to facilitate the discussion of the drawings and are not intended to restrict the application of the embodiments of this invention. Therefore, the following detailed description is not to be taken in a limiting sense and the scope of the embodiments of the present invention are defined by the appended claims and their equivalents.

Figure 1:
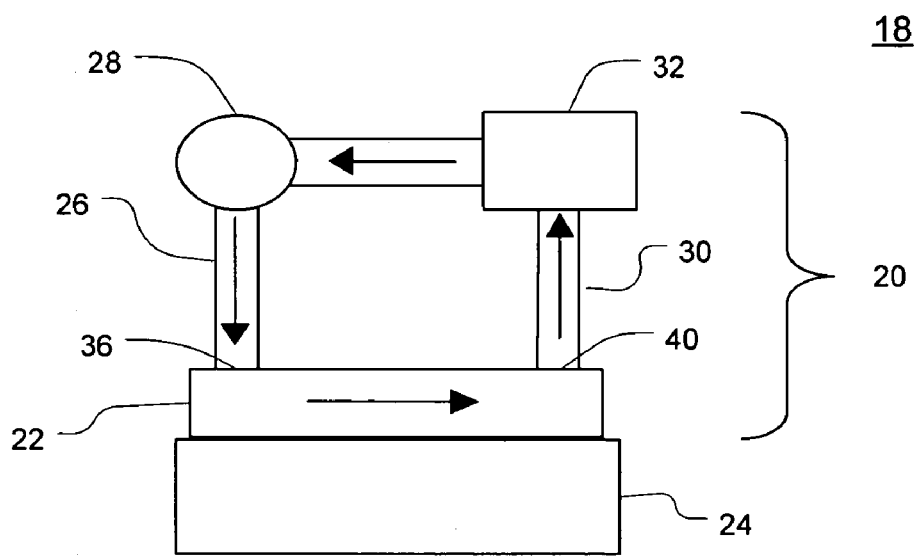
FIG. 1 illustrates an electronic assembly with a thermal management arrangement, in accordance with an embodiment of the present invention.

FIG. 1 illustrates a cross-sectional view of an electronic assembly 18 including a thermal management arrangement 20 in accordance with an embodiment of this invention. In this embodiment the thermal management arrangement 20 may be coupled to a semiconductor package 24 in order to facilitate the management of excess heat generated by the semiconductor package 24. The thermal management arrangement 20 may include a channel structure 22 having a number of channels designed to thermally couple a cooling fluid to the semiconductor package 24 to allow the cooling fluid to absorb at least a portion of the excess heat generated by the semiconductor package 24. In various embodiments the channel structure may include, but is not limited to, a cold plate, an integrated heat spreader, or part of the semiconductor package 24 itself.

In one embodiment, the channel structure 22 may be coupled to the semiconductor package 24 with a thermal interface material in order to decrease the thermal resistance in the pathway between the semiconductor package 24 and the fluid. Examples of types of thermal interface materials include, but are not limited to, a thin layer of solder paste, phase-change materials, thermal adhesives (e.g., a highly filled epoxy or acrylic), double-sided thermal tape, and thermal interface pads. In another embodiment, the channel structure 22 may be coupled to an integrated heat spreader (not show) that is thermally coupled to the semiconductor package.

In one embodiment, the thermal management arrangement 20 may include an input flow distributor 26 adapted to receive an influent cooling fluid flow from a pump 28 and to facilitate the transmission of the influent cooling fluid flow to the channel structure 22 as distributed fluid flows at a flow distributive interface 36. In one embodiment, the thermal management arrangement 20 may also include an output flow distributor 30 coupled to the channel structure 22 at another flow distributive interface 40. In this embodiment, the output flow distributor 30 may receive the distributed flows from the channel structure 22 and transmit an effluent flow to a remote heat exchanger 32. The distributed transmission of the cooling fluid at the flow distributive interfaces 36 and 40 may facilitate the adjustment of volumetric flow rates through the channels in the channel structure 22, as will be discussed further below.

In one embodiment the pump 28 may be used to create a pressure differential to facilitate the flow of the fluid through the channels of the channel structure 22. The fluid may absorb at least a portion of the excess heat dissipated from the semiconductor package 24 as it flows through the channels. The heated fluid may flow towards the remote heat exchanger 32 where at least a portion of the absorbed heat may be dissipated.

The heat exchanger 32 may be any known or to-be-designed heat dissipation mechanism. In one embodiment the heat exchanger 32 may dissipate excess thermal energy from the cooling fluid and present the fluid to the pump 28 so that it may be reintroduced to the channel structure 22. Examples of the cooling fluid may include, but are not limited to a gas (e.g., air) and a liquid (e.g., water, alcohol, perfluorinated liquids, etc.).

The semiconductor package 24 could include an integrated circuit, which may be formed in a rectangular piece of semiconductor material called a chip or a die. Examples of the semiconductor material include, but are not limited to silicon, silicon on sapphire, and gallium arsenide.

In various embodiments the flow distributors 26 and 30 may be made of a conductive material (e.g., copper) or a relatively nonconductive material (e.g., plastic). In one embodiment the flow distributors 26 and 30 may be coupled to the channel structure 22 at the flow distributive interfaces 36 and 40 with an adhesive such as, for example, an epoxy. In another embodiment, the flow distributors 26 and 30 may be press fit over/into tubes extending from the channel structure 22 at the flow distributive interfaces 36 and 40. Various embodiments may use a variety of techniques to couple these elements to one another.

Figure 2:
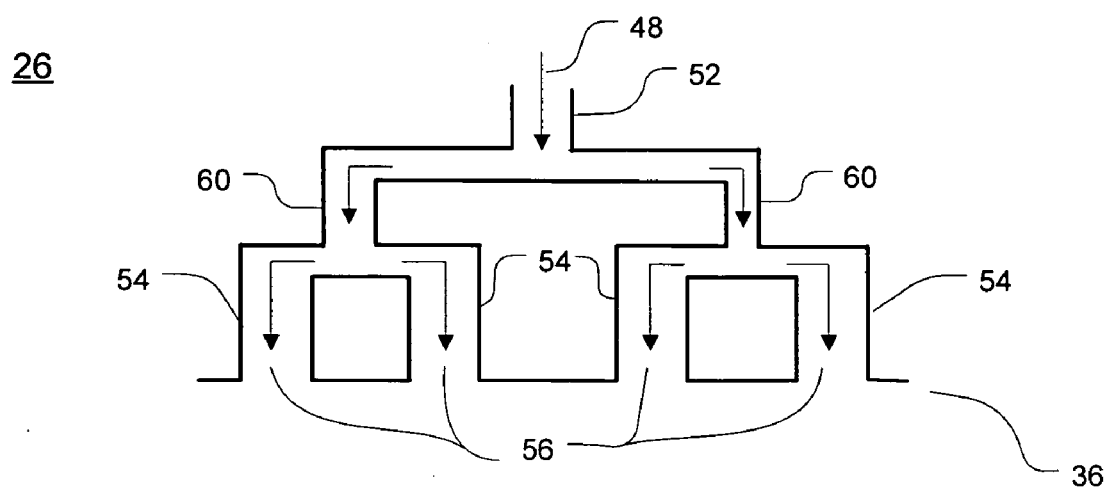
FIG. 2 illustrates cooling fluid flowing through channel segments of an input flow distributor, in accordance with an embodiment of the present invention.
Figure 3:
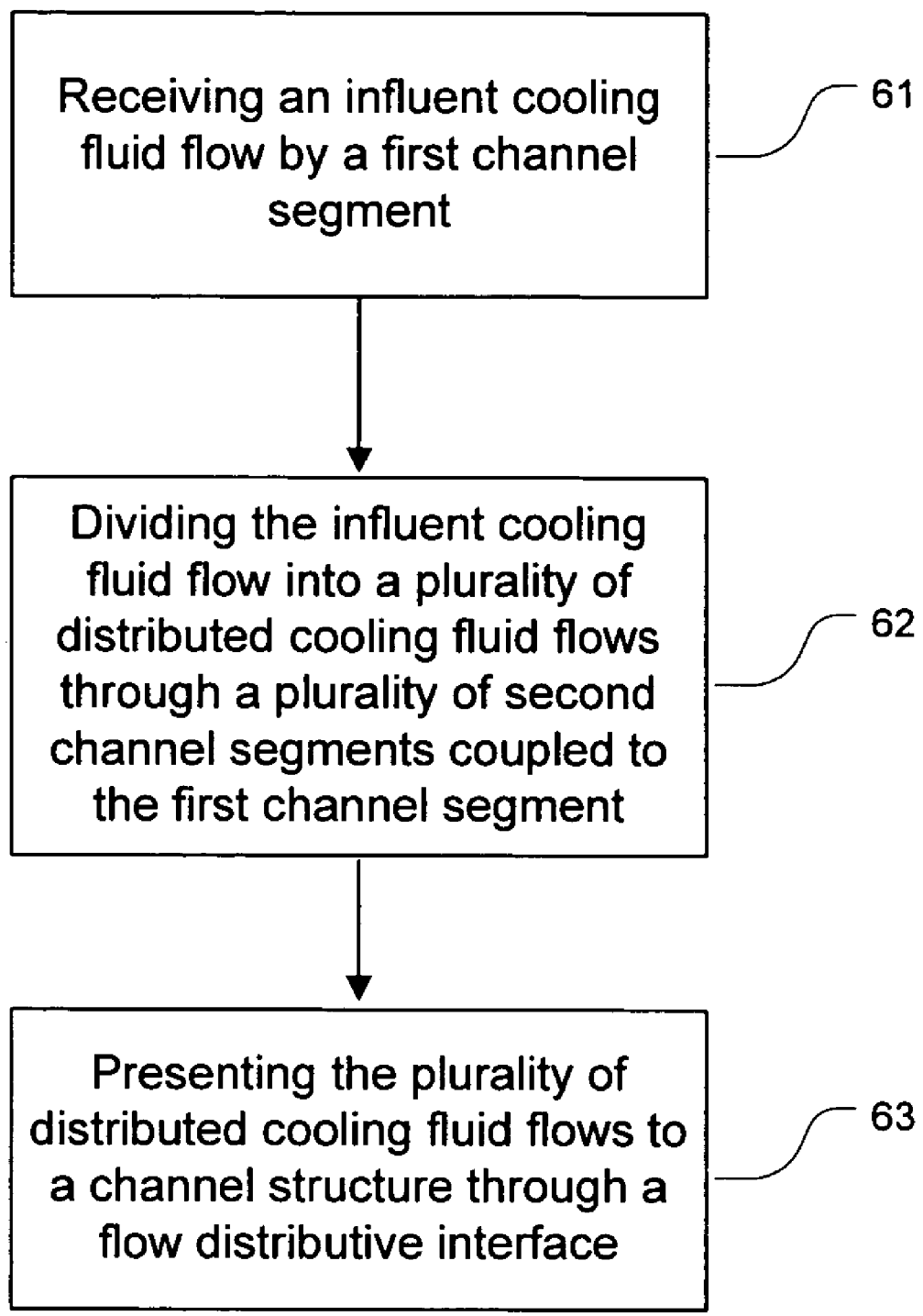
FIG. 3 depicts a flow chart describing cooling fluid flowing through the input flow distributor, in accordance with an embodiment of the present invention.

FIG. 2 illustrates cooling fluid flowing through channel segments of the input flow distributor 26, in accordance with an embodiment of this invention. Referring also to FIG. 3 (reference numbers in parentheses), the input flow distributor 26 may be designed to receive an influent cooling fluid flow 48 in a first channel segment 52 (61). The input flow distributor 26 may then divide the influent cooling fluid flow 48 into distributed fluid flows 56 for the second channel segments 54 (62). In one embodiment, the second channel segments 54 may be adapted to present the distributed fluid flows 56 to the channel structure 22 through the flow distributive interface 36 (63). The flow distributive interface 36 may translate into a less concentrated and more dispersed flow rate distribution through the channels of the channel structure 22 as compared to the flow rate distributions of prior art devices.

The input flow distributor 26 of this embodiment may be largely symmetrical, which may result in substantially equivalent flow rates for the distributed fluid flows 56. However, other embodiments may include asymmetrical flow distributors.

In one embodiment, the first channel segment 52 may be coupled to the second channel segments 54 by being incrementally branched through one or more levels of intermediate channel segments 60. Incremental flow divisions may lower the flow resistance experienced in the first channel segment 52. In various embodiments, the influent cooling fluid flow 48 may be partitioned into the distributed fluid flows 56 through any number of channel segments.

Figure 4:
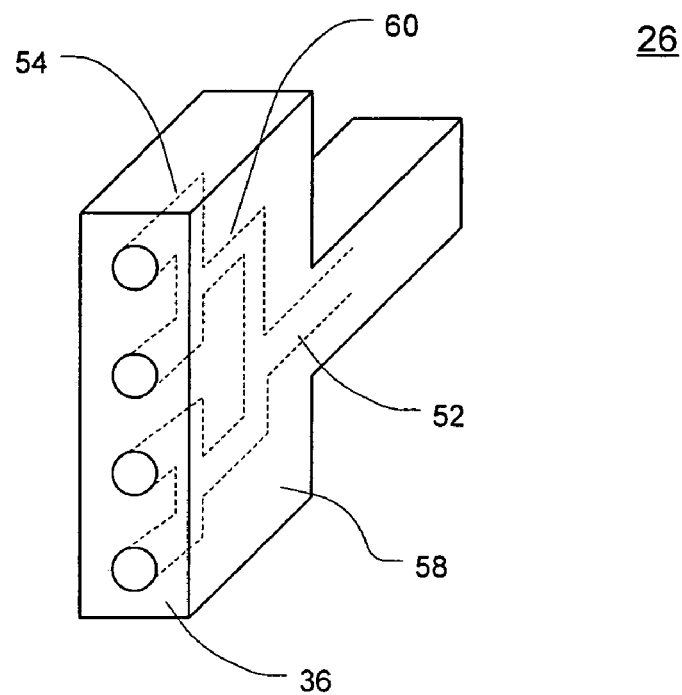
FIG. 4 illustrates a perspective view of the input flow distributor, in accordance with an embodiment of the present invention.

FIG. 4 illustrates a perspective view of the flow distributor 26, in accordance with an embodiment of the present invention. This embodiment depicts the channel segments of the input flow distributor 26 being disposed within a casing 58. Alternative embodiments could include the input flow distributor 26 being made of a piping structure, or by some other manner.

Figure 5:
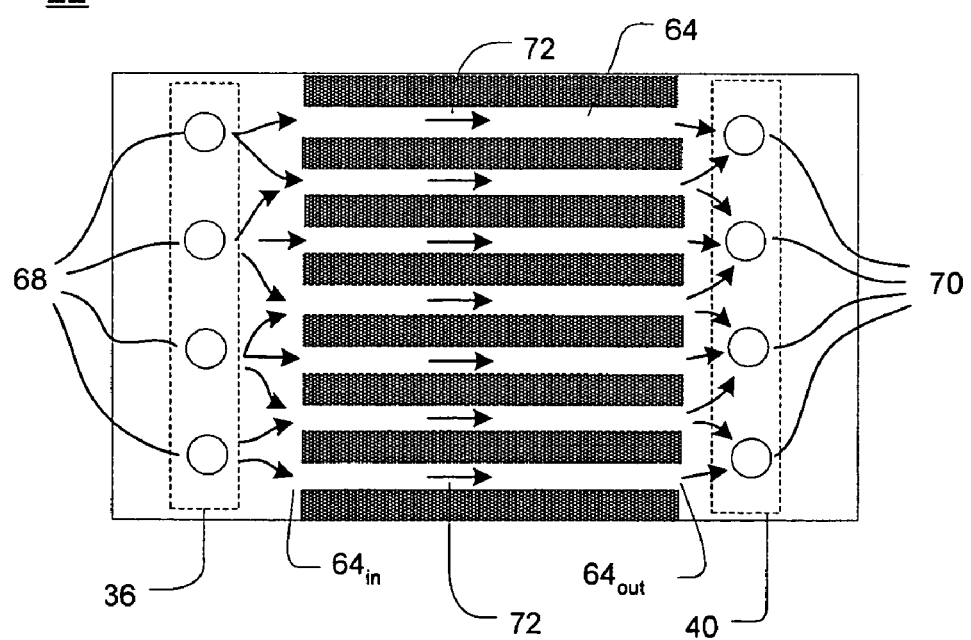
FIG. 5 illustrates a top view of cooling fluid flowing through a channel structure in accordance with an embodiment of the present invention.

FIG. 5 illustrates a top-view of fluid flows through cooling channels of the channel structure 22, in accordance with an embodiment of the present invention. In this embodiment a number of cooling channels 64 may be arranged in a substantially parallel fashion. A number of cooling channel flows 72 may travel through the cooling channels 64 and absorb excess heat generated by the semiconductor package 24. The cooling channels 64 may have inputs $64_{in}$ that are flow coupled with one or more inlets 68 to allow the cooling fluid to travel from the inlets 68 into the cooling channels 64. The input flow distributor 26 may be coupled to the flow inlets 68 at the flow distributive interface 36 to present the distributed cooling fluid flows 56 to the channel structure 22.

In one embodiment, a distributed fluid flow entering from a particular inlet may tend to flow into cooling channels that are substantially in-line with the inlet. Therefore, each inlet may be primarily flow coupled with a subset of cooling channels that require a relatively small amount of bend in the flow lines. By evenly spacing the inlets 68 it may be possible to provide relatively uniform flow rates, and therefore heat transfer abilities, throughout the cooling channels 64. Various embodiments may adjust the relative heat transfer abilities of the cooling channels 64 by adjusting the number and/or positioning of the inlets 68.

In one embodiment, the flow inlets 68 may be mirrored by substantially symmetrical flow outlets 70. The flow outlets 70 may be primarily flow coupled with outputs $64_{out}$ of the same channels that the complementary inlets 68 are flow coupled with. In various embodiments, the number and positioning of the flow inlets 68 and the flow outlets 70 may also be asymmetrical. The flow outlets 70 may be coupled to the output flow distributor 30 at the flow distributive interface 40. In one embodiment, the output flow distributor 30 may be structurally similar to the input flow distributor 26 depicted in FIG. 2. The output flow distributor 30 may provide a graduated increase in flow concentration in order to alleviate the bottleneck effect that may occur if all of the cooling channel flows 72 were forced to exit through the same outlet. Still, other embodiments, which may be less concerned with potential bottleneck effects, may use a single outlet.

In one embodiment, the semiconductor package 24 may have varying heat gradients across the surface of the package. These heat gradients may be the result of certain areas of the semiconductor package 24 being more active than other areas (for example, the core logic area may generate more heat than the cache). One embodiment may have increased flow rates for the channels that correspond to the areas with higher heat output.

Figure 6:
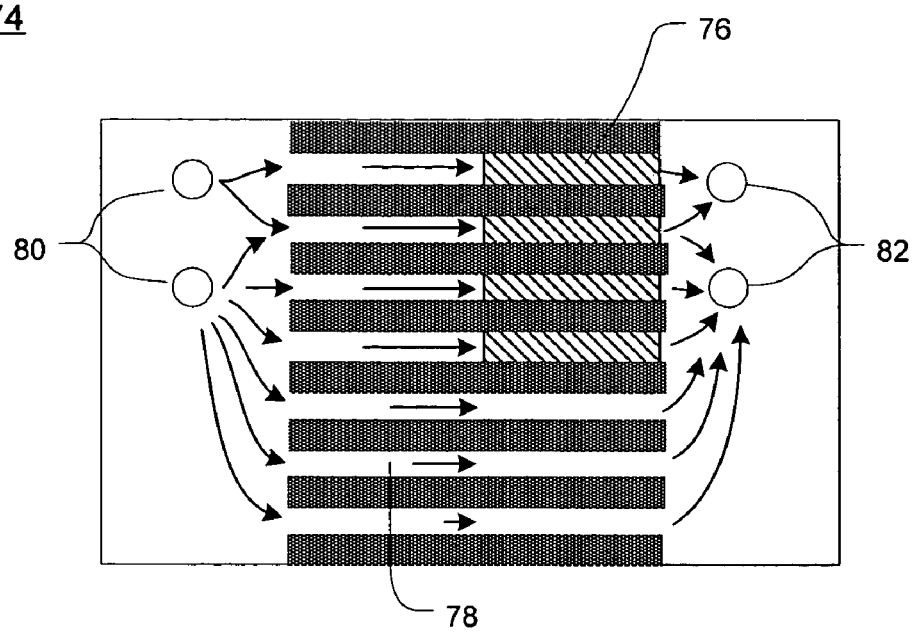
FIG. 6 illustrates a top view of cooling fluid flowing through a channel structure having high and low heat flux areas, in accordance with an embodiment of the present invention.

FIG. 6 illustrates an embodiment having inlets and outlets adapted to adjust the relative flow rates through the channels of a channel structure 74. In this embodiment, the channel structure 74 may include a high heat flux area 76 and a low heat flux area 78. These heat flux areas may correspond to the heat gradients of the semiconductor package, discussed above. Inlets 80 and outlets 82 may be positioned such that they are primarily flow coupled with cooling channels that are in the high heat flux area 76. The flow lines from the inlets 80 to the low heat flux channels may bend more than the flow lines from the inlets 80 to the high heat flux channels. This may result in the flow rates being greater in the high heat flux channels than in the low heat flux channels, which could result in a corresponding increase in the heat transfer ability of the high heat flux channels.

The inlets 80 and outlets 82 of the channel structure 74 may be coupled to complementarily adapted flow distributors. The channel structure 74 and flow distributors may be interchangeable with the channel structure 22 and flow distributors 26 and 30 of FIG. 1. In general, the channel structure (including the inlets and outlets) and flow distributors may be adapted to provide a variety of flow distributions for a variety of embodiments of this invention.

Figure 7:
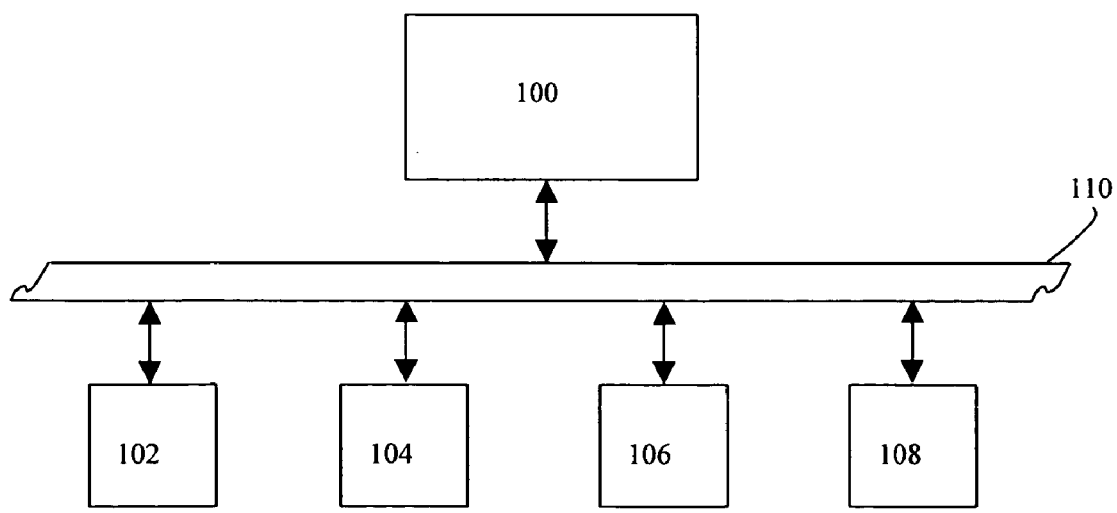
FIG. 7 depicts a system including an electronic assembly in accordance with an embodiment of the present invention.

Referring to FIG. 7, there is illustrated one of many possible systems in which embodiments of the present invention may be used. The electronic assembly 100 may be similar to the electronic assembly 18 depicted in FIG. 1. In one embodiment, the electronic assembly 100 may include a microprocessor. In an alternate embodiment, the electronic assembly 100 may include an application specific IC (ASIC). Integrated circuits found in chipsets (e.g., graphics, sound, and control chipsets) may also be packaged in accordance with embodiments of this invention.

For the embodiment depicted by FIG. 7, the system 90 may also include a main memory 102, a graphics processor 104, a mass storage device 106, and an input/output module 108 coupled to each other by way of a bus 110, as shown. Examples of the memory 102 include but are not limited to static random access memory (SRAM) and dynamic random access memory (DRAM). Examples of the mass storage device 106 include but are not limited to a hard disk drive, a flash drive, a compact disk drive (CD), a digital versatile disk drive (DVD), and so forth. Examples of the input/output modules 108 include but are not limited to a keyboard, cursor control devices, a display, a network interface, and so forth. Examples of the bus 110 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, an audio/video controller, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising:
   a first channel segment, to receive a cooling fluid to absorb heat generated by a semiconductor package;
   a plurality of second channel segments coupled to the first channel segment, to provide a flow distributive interface to facilitate a distributed transmission of the cooling fluid; and
   a channel structure, coupled to the flow distributive interface, having
      a first cooling channel with an input to receive a first portion of the cooling fluid and an output to transmit the first portion of the cooling fluid;
      a second cooling channel with an input to receive a second portion of the cooling fluid and an output to transmit the second portion of the cooling fluid; and
      a plurality of inlets, to be respectively coupled to the plurality of second channel segments at the flow distributive interface, the plurality of inlets to receive distributed cooling fluid flows from the plurality of second channel segments and to transmit the distributed cooling fluid flows to the inputs of the first and second cooling channels.

2. The apparatus of claim 1, further comprising:
   a pump, coupled to the first channel segment, to provide an influent cooling fluid flow.

3. The apparatus of claim 2, wherein the first channel segment is to receive the influent cooling fluid flow and the plurality of second channel segments are to output the distributed cooling fluid flows at the flow distributive interface.

4. The apparatus of claim 2, further comprising:
   a third channel segment, coupled to an outlet of the channel structure, the outlet to receive cooling channel flows from the outputs of the first and second cooling channels; and
   a heat exchanger, coupled to the third channel segment, to receive the cooling fluid and to disperse at least a portion of any heat absorbed by the cooling fluid.

5. The apparatus of claim 4, further comprising:
   a plurality of fourth channel segments, to couple the third channel segment to a plurality of outlets of the channel structure.

* * * * *